United States Patent
Chong et al.

(10) Patent No.: US 9,859,236 B2
(45) Date of Patent: Jan. 2, 2018

(54) INTEGRATED CIRCUITS HAVING COPPER BONDING STRUCTURES WITH SILICON CARBON NITRIDE PASSIVATION LAYERS THEREON AND METHODS FOR FABRICATING SAME

(71) Applicant: GLOBALFOUNDRIES Singapore Pte. Ltd., Singapore (SG)

(72) Inventors: Meng Meng Chong, Singapore (SG); Xuesong Rao, Singapore (SG); Chim Seng Seet, Singapore (SG); Xiaohua Zhan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/816,648

(22) Filed: Aug. 3, 2015

(65) Prior Publication Data
US 2017/0040272 A1 Feb. 9, 2017

(51) Int. Cl.
*H01L 23/00* (2006.01)
*C22C 9/01* (2006.01)
*C22C 9/05* (2006.01)
*C22C 9/00* (2006.01)

(52) U.S. Cl.
CPC .............. *H01L 24/05* (2013.01); *C22C 9/00* (2013.01); *C22C 9/01* (2013.01); *C22C 9/05* (2013.01); *H01L 24/03* (2013.01); *H01L 24/85* (2013.01); *H01L 2224/0391* (2013.01); *H01L 2224/04042* (2013.01); *H01L 2224/05023* (2013.01); *H01L 2224/05147* (2013.01); *H01L 2224/858* (2013.01)

(58) Field of Classification Search
CPC .......... H01L 29/4908; H01L 23/53238; H01L 23/53223; H01L 23/53219; H01L 23/00; H01L 24/03; H01L 24/05; H01L 24/85
USPC ........................................................ 257/741
See application file for complete search history.

(56) References Cited

U.S. PATENT DOCUMENTS

| | | | |
|---|---|---|---|
| 2004/0150112 A1* | 8/2004 | Oda .................. | H01L 23/53238 257/758 |
| 2008/0251940 A1* | 10/2008 | Lee ..................... | H01L 23/3128 257/777 |
| 2010/0099250 A1* | 4/2010 | Jang ................. | H01L 21/76849 438/614 |
| 2015/0318420 A1* | 11/2015 | Sewell .................. | H01L 31/18 136/256 |

* cited by examiner

*Primary Examiner* — Chuong A Luu
(74) *Attorney, Agent, or Firm* — Lorenz & Kopf, LLP

(57) ABSTRACT

Integrated circuits having copper bonding structures with silicon carbon nitride passivation layers and methods for making the same are provided. In an exemplary embodiment, an integrated circuit includes a substrate and a copper bonding structure having a contact surface. The copper bonding structure overlies the substrate. A passivation layer formed of silicon carbon nitride is disposed on the contact surface.

20 Claims, 1 Drawing Sheet

INTEGRATED CIRCUITS HAVING COPPER BONDING STRUCTURES WITH SILICON CARBON NITRIDE PASSIVATION LAYERS THEREON AND METHODS FOR FABRICATING SAME

TECHNICAL FIELD

The present disclosure generally relates to integrated circuits having copper bonding structures with passivation layers and methods for fabricating same. More particularly, the present disclosure relates to integrated circuits that have copper bonding structures with silicon carbon nitride passivation layers and methods for fabricating same.

BACKGROUND

Integrated circuits are formed on and in semiconductor substrates using a number of different processing operations that create circuit elements. In order to access circuitry associated with the semiconductor substrate, bond pads are formed on the integrated circuits. Bond pads provide the means for transfer of electrical signals and power from and to the circuit elements via probes, bonding wires, conductive bumps, etc.

The bonding pads and the conductive elements thereto must be electrically conductive to form part of the desired electrical connections and, therefore, they are typically made from a metal or metal alloy. Until recently, aluminum (Al) has been the metal of choice for making bonding structures for integrated circuits. However, industry preferences for smaller and more densely packed active circuit components has led to the wider use of copper (Cu) and copper alloys as a substitute for aluminum. Copper has a higher electrical resistivity than Al and, because copper is electropositive, it is less vulnerable to electro-chemical corrosion. However, adhesion and reliability of the bonds between bonding structures and conductive elements are primary concerns to ensure proper and continued functioning of the integrated circuits and active circuit components thereon. Copper is more susceptible to chemical corrosion in air and, therefore, copper oxides tend to form when in contact with air and moisture. As a result, when aluminum or gold wires are electrically connected to copper bonding structures, the bond between the wire and the bonding structure is susceptible to corrosion, oxidation and thermal diffusion problems.

To protect the surface of a copper bonding structure and thereby facilitate formation of a reliable bond between the conductive element and the copper bonding structure, some bonding structures have been formed with a protective cap layer made of another metal, e.g., aluminum, aluminum alloy, tungsten, titanium, or a phosphorus- or boron-containing metal alloy, that is deposited over the surface of the copper bonding structure. More recently, to reduce costs and improve passivation, silicon nitride (SiN) deposited by plasma enhanced vapor deposition (PECVD) has been suggested to replace the metal-containing materials to form passivation layers over copper-containing bond pads. This has resulted in bonding structures having passivation layers with some satisfactory properties. However, the deposition rate via PECVD has been found to be too quick and has not provide sufficient control to produce a SiN layer of the desired minimal thickness and high uniformity. Additionally, greater levels of passivation are required than can be achieved by SiN passivation layers on copper bonding structures.

Accordingly, it is desirable to provide integrated circuits having copper bonding structures with passivation layers thereon that provide improved protection from corrosion. It is further desirable to provide methods for fabricating such integrated circuits. Other desirable features and characteristics of the integrated circuits and method disclosed herein will become apparent from the subsequent detailed description and the appended claims, taken in conjunction with the accompanying drawings and this background discussion.

BRIEF SUMMARY

Integrated circuits having copper bonding structures with silicon carbon nitride passivation layers and methods for making such integrated circuits are provided. In an exemplary embodiment, an integrated circuit includes a substrate and a copper bonding structure having a contact surface. The copper bonding structure overlies the substrate. A passivation layer comprising silicon carbon nitride is disposed on the contact surface.

In another embodiment, a method for fabricating an integrated circuit includes providing a semiconductor substrate having a copper bonding structure overlying a surface of the semiconductor substrate. The copper bonding structure has a contact surface. A passivation layer comprising silicon carbon nitride is formed on the contact surface of the copper bonding structure using a chemical vapor deposition (CVD) technique.

In a further embodiment, a method for fabricating an integrated circuit includes providing a semiconductor substrate having a copper bonding structure overlying a surface of the semiconductor substrate. The copper bonding structure has a contact surface. A passivation layer comprising silicon carbon nitride is deposited on the contact surface of the copper bonding structure using plasma-enhanced chemical vapor deposition. A conductive element is electrically coupled to the copper bonding structure after depositing the passivation layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments disclosed herein or the application and uses thereof. Furthermore, there is no intention to be bound by any theory presented in the preceding background or the following detailed description.

Generally, integrated circuits having copper bonding structures with passivation layers of silicon carbon nitride ($Si_xC_yN_z$), as well as methods to fabricate them, are described hereinbelow. The copper bonding structure electrically couples an integrated circuit to other semiconductor devices, integrated circuits, power sources, and/or the like. The $Si_xC_yN_z$ passivation layer functions as a protective layer that minimizes oxidative corrosion of the copper bonding structure. Accordingly, when conductive elements, such as metal wires, are electrically coupled to the copper bonding structure, the bond has robust adhesion and reliability which in turn enables reliable electrical connections to be formed to the integrated circuit. It is noted that the passivation layer must be sufficiently thick to prevent oxidation corrosion of the copper bonding structure, yet also be sufficiently thin to allow formation of a secure bond when a conductive element is coupled thereto by conventional bonding methods.

Figure 1:
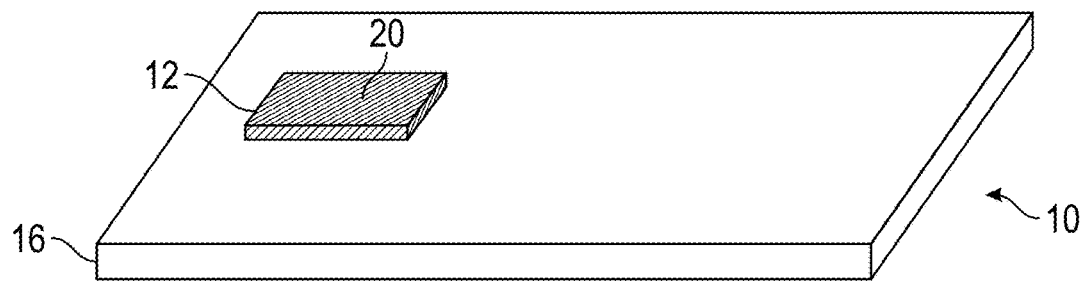
FIGS. 1-3 are schematic views of an integrated circuit having a copper bonding structure and a passivation layer and a method for fabricating the same in accordance with an embodiment.
Figure 2:
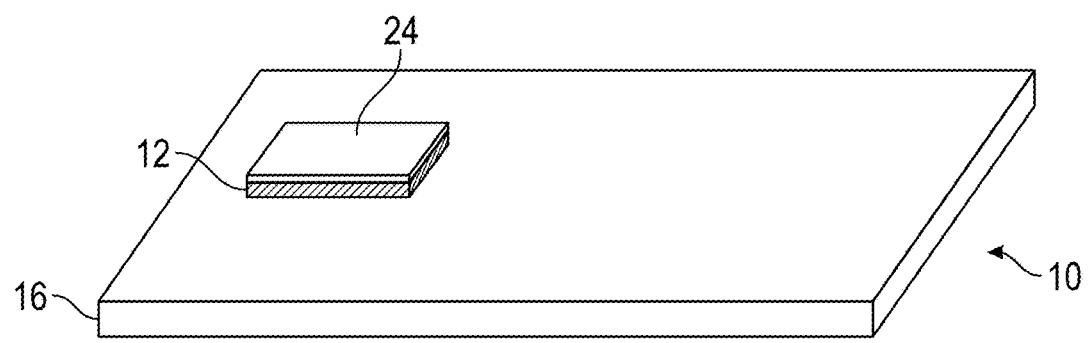

FIGS. 1 and 2 illustrate, in perspective view, methods for fabricating an integrated circuit 10 in accordance with an exemplary embodiment. As used herein, the term "integrated circuit" shall mean one or more electronic components (not shown) such as capacitors, resistors, diodes of any type, solar cells, transistors of any type, memory of any type, and the like, and any electrical connection therebetween (also not shown) on a semiconductor substrate 16. The term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like.

Integrated circuit 10 further includes a copper bonding structure 12 overlying semiconductor substrate 16. As used herein, the term "overlying" encompasses the terms "on" and "over." In this regard, the copper bonding structure 12 may lie directly on the semiconductor substrate 16 such that it physically contacts the semiconductor substrate 16 or it may lie over the semiconductor substrate such that additional layers of material (not shown) are interposed between the semiconductor substrate and the copper bonding structure.

The copper bonding structure 12 is electrically conductive and has a contact surface 20 for electrically connecting the integrated circuit 10 to another device (not shown) such as a semiconductor device, another integrated circuit (IC), a power source, and the like. The copper bonding structure 12 may be made from pure copper, doped copper, copper alloy, or a combination thereof. In some embodiments, the copper bonding structure 12 is made of pure copper, which means at least 99.9 percent by weight (wt %) copper, based on the total weight of the copper bonding structure. In other exemplary embodiments, the copper bonding structure 12 is made of doped copper. Suitable doped copper includes copper that comprises at least 90 wt % copper, based on the total weight of the copper bonding structure, with the remainder comprising one or more metals other than copper. Examples of metals that can be used to dope the copper used to form the copper bonding structure included, but are not limited to, aluminum, manganese, and gold and combinations thereof. In still other embodiments, for example, the copper bonding structure 12 is made of a copper alloy. Suitable copper alloys are those that comprise at least 55 wt % copper, based on the total weight of the copper bonding structure, with the remainder comprising one or more metals other than copper. Metals suitable for use in the copper alloy contemplated herein may be, for example, without limitation, one or more metals selected from aluminum and gold.

The copper bonding structure 12 may be formed on the integrated circuit 10 by any method or technique known now or in the future to persons of ordinary skill in the relevant art. Generally, methods and techniques for forming a copper bonding structure 12 on an integrated circuit 10 involve multiple-step processes similar to those employed for fabricating the integrated circuit 10, as well as various features thereon, including, for example, a combination of conventional photolithographic and chemical processing steps that sequentially and selectively mask, overlay, deposit, etch or remove material on the semiconductor substrate 16.

Referring to FIG. 2, the method continues with the formation of a passivation layer 24 overlying contact surface 20 of copper bonding structure 12. Passivation layer 24 is formed of silicon carbon nitride ($Si_xC_yN_z$), where x is $0<x\leq1$, $0<y\leq1$, and $0<z\leq1$. Silicon carbon nitride ($Si_xC_yN_z$) is not limited to stoichiometric SiCN but can include any ratio of silicon, carbon, and nitrogen that results in a silicon carbon nitride layer that achieves passivation as described herein. The passivation layer 24 typically has a thickness of from about 3 to about 15 nanometers (nm). For example, in some embodiments, the passivation layer may have a thickness of from about 3 to about 13 nm, or from about 3 to about 10 nm, or from about 3 to about 8 nm, or even from about 5 to about 8 nm. In other embodiments, the passivation layer may have a thickness of from about 5 to about 15 nm, or from about 6 to about 15 nm, or from about 8 to about 15 nm, or from about 5 to about 13 nm, or even from about 5 to about 10 nm.

The passivation layer 24 may be deposited on the contact surface 20 of the copper bonding structure 12 by any deposition method that allows particle size and particle distribution control to enable formation of a passivation layer 24 having uniform thickness and homogenous composition. For example, without limitation, the passivation layer may be formed on the contact surface 20 of the copper bonding structure 12 by chemical vapor deposition (CVD) techniques including high density plasma (HDP) CVD, plasma enhanced chemical vapor deposition (PECVD), and the like.

Because PECVD generally provides better particle size and layer thickness control at relatively low deposition rates than other deposition techniques, PECVD is believed to be more suitable for forming the passivation layer 24 according to the method contemplated herein. Generally, PECVD techniques involve converting a selected material (e.g., $Si_xC_yN_z$) from particulate or solid phase to plasma phase using radio frequency (RF) or direct current energy discharged between two electrodes. In some embodiments of the method described herein, the use of RF energy is favored for creating the plasma. The resulting plasma contains the $Si_xC_yN_z$ in gas (vapor) phase. The $Si_xC_yN_z$ is then deposited onto the surface of a substrate, such as on the contact surface 20 of the copper bonding structure 12 on integrated circuit 10, as contemplated herein.

As already mentioned earlier, in an embodiment the passivation layer 24 is sufficiently thick to prevent oxidation corrosion of the copper bonding structure, but also is sufficiently thin to allow formation of a secure bond when a conductive element (such as a wire) is bonded thereto by conventional bonding methods. Accordingly, the process for forming the passivation layer 24 provides control of plasma formation and deposition so as to form a passivation layer in this desired thickness range. It has been discovered that PECVD formation of the passivation layer 24 comprising $Si_xC_yN_z$, within specified operating parameters, provides the desired degree of control for forming the above-described passivation layer 24 on copper bonding structure 12 that allows formation of bonds between the copper bonding structure 12 and conductive elements 26 (see FIG. 3), such as a wire, that have excellent bond adhesion and strength. More particularly, in an exemplary embodiment, the process includes operating temperatures during forming of the passivation layer 24 by PECVD in a range of from about 250 to about 400° C., for example, from about 250 to about 350° C., or from about 300 to about 400° C. In another embodiment, the process includes operating pressure during PECVD formation of the passivation layer 24 in a range of from about 400 to about 800 Pascals (Pa), for example, from about 550 to about 800 Pa, or from about 400 to about 650 Pa. In a further embodiment, the process includes RF energy used for the PECVD formation of the passivation layer 24 with silicon carbon nitride in a range of from about 180 to 500 Watts (W). For example, without limitation, the RF energy during the PECVD process is in a range of from about 180 to about 500 W, or even from about 200 to about 400 W. In another embodiment, the process include flow rates of ammonia ($NH_3$) during the PECVD process in a range of from about 350 to about 700 standard cubic centimeters per minute (sccm). For example, without limitation, the ammonia flow rate is from about 350 to about 600 sccm, or even from about 400 to about 700 sccm. In an embodiment, the flow rate of tetramethylsilane (TMS) during the PECVD formation of the passivation layer 24 comprising silicon carbon nitride is in a range of from about 150 to about 450 sccm, such as for example, without limitation, from about 150 to about 300 sccm, or even from about 250 to about 450 sccm.

In a further embodiment, the formation of the passivation layer 24 by PECVD is performed at a relatively low deposition rate, for example, a rate that requires at least about 5 seconds (s) to form a passivation layer having a thickness of at least about 3 nanometers (nm) (i.e., no greater than about 3 nm per 5 s, or about 0.6 nm/s). In one embodiment, the PECVD is performed at a deposition rate of no greater than about 3 nm/6 s (i.e., 0.5 nm/s), or no greater than about 3 nm/7 s, or even no greater than about 3 nm/8 s. These low deposition rates provide the necessary control of the thickness and homogeneity of the silicon carbon nitride passivation layer 24 that will provide maximum corrosion protection for the copper bonding structure 12 while also allowing formation of a bond with the conductive element 26 (see FIG. 3) that has maximum bond adhesion and reliability.

Figure 3:
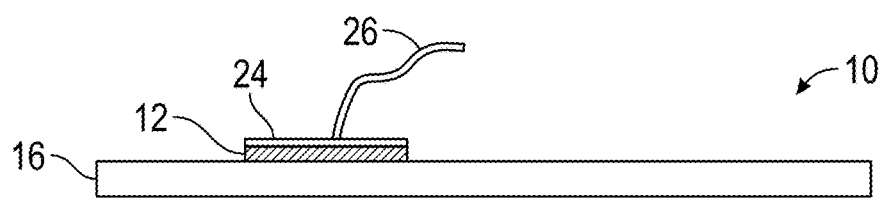

With reference to FIG. 3, in another exemplary embodiment, the method for fabricating integrated circuit 10 includes bonding a conductive element 26, such as a wire or similar electrically conductive connector, to the copper bonding structure 12, through the passivation layer 24. This enables electrical connection of the integrated circuit 10 to a semiconductor device or to another integrated circuit (not shown). In embodiments in which wires are used as the conductive element 26, the wire may comprise gold, aluminum, copper, or any conventional material or combinations thereof. Furthermore, in some embodiments, modified wire such as palladium-coated copper (PCC) wire may be used as the metal component. One standard technique for attaching a conductive element 26 to a copper bonding structure 12 is ball bonding, which is commonly used for gold- and copper-based wire and usually requires heat. More particularly, as is familiar to persons of ordinary skill in the relevant art, in ball bonding, the end of the wire is shaped as a ball of greater diameter than the main body of the wire (not shown in the figures). The ball at the end of the wire is attached (bonded) to the contact surface 20 of the copper bonding structure 12 using a combination of heat, pressure, and ultrasonic energy applied to the ball to form a weld.

Examples

The following are examples of integrated circuits with passivation layers on copper bonding structures as contemplated herein. The examples are provided for illustration purposes only and are not meant to limit the various embodiments of the present invention in any way.

Various samples of passivation layers of varying thickness and containing either silicon nitride or silicon carbon nitride were formed on copper substrates using plasma enhanced chemical vapor deposition (PECVD). The PECVD operating conditions used were as follows:

Apparatus Manufacturer & Model: Applied Materials Producer® PECVD
Temperature: 300-400° C.
Pressure: 400-650 Pascals
RF power: 150-350 Watts
$NH_3$ (precursor) flow rate: 550-750 sccm
TMS (precursor) flow rate: 250-450 sccm The passivation layers thus formed were tested for oxygen atomic concentration after being subjected to a baking test and a shelf life accelerated test (SLAT), which were performed as follows.

Baking Test—

After silicon nitride or silicon carbon nitride deposition, samples were brought for optical inspection to capture a copper bond pad image before baking. Samples were then transferred into an oven and baked for 1 hour in an ambient environment at 250° C. Optical inspection was performed on samples once again, post-baking, to capture a copper bond pad image for comparison with the earlier image to note if any discoloration on the copper bond pad had occurred. Auger electron spectroscopy analysis was subsequently performed on the samples to characterize the element atomic concentration, especially oxygen concentration, at the passivation layer/copper interface in order to verify whether oxygen had diffused through the passivation layer.

SLAT—

After silicon nitride or silicon carbon nitride deposition, samples were brought for optical inspection to capture a copper bond pad image before baking. Subsequently, samples were transferred into an oven and subjected to 75° C. and 55% relative humidity for 17 hours. The samples were then sent for optical inspection to note if any discoloration on the copper bond pad had occurred. Finally, Auger analysis was performed on the samples with similar conditions as mentioned above.

The results of testing are presented below in Tables 1 and 2. Table 1 provides the results of the Auger analysis measuring the oxygen atomic concentration, at the surface of each passivation layer. Table 2 provides the results of the Auger analysis measuring the oxygen atomic concentration at the interface between the Cu pad and the passivation layer. Table 3 provides deposition rates for the deposition of silicon nitride and silicon carbon nitride using the above conditions.

TABLE 1

| BLANKET SAMPLES | REMARKS | OXYGEN ATOMIC CONCENTRATION (%) SURFACE | BLANKET SAMPLES | OXYGEN ATOMIC CONCENTRATION (%) SURFACE |
|---|---|---|---|---|
| Bare Copper | POST | 40.5 | | |
| $Si_xC_yN_z$ 20 A (2 nm)* | BAKING | 10.41 | | |
| $Si_xC_yN_z$ 60 A (6 nm) | | 7.86 | SiN 50 A (5 nm) | 20.81 |
| $Si_xC_yN_z$ 100 A (10 nm) | | 7.84 | SiN 100 A (10 nm) | 17.59 |
| $Si_xC_yN_z$ 20 A (2 nm) | POST SLAT | 10.91 | SiN 50 A (5 nm) | 26.09 |

*"A" means Angstroms and "nm" means nanometer

TABLE 2

| BLANKET SAMPLES | REMARKS | OXYGEN ATOMIC CONCENTRATION (%) INTERFACE | BLANKET SAMPLES | OXYGEN ATOMIC CONCENTRATION (%) INTERFACE |
|---|---|---|---|---|
| Bare Copper | POST | 40.5 | | |
| $Si_xC_yN_z$ 20 A (2 nm) | BAKING | 2.2 | | |
| $Si_xC_yN_z$ 60 A (6 nm) | | 1.79 | SiN 50 A (5 nm) | 2.99 |
| $Si_xC_yN_z$ 100 A (10 nm) | | 1.69 | SiN 100 A (10 nm) | 1.47 |
| $Si_xC_yN_z$ 20 A (2 nm) | POST SLAT | 2.11 | SiN 50 A (5 nm) | 2.72 |

* "A" means Angstroms and "nm" means nanometer

It is noted that the oxygen atomic concentration exponentially decreases from capping layer surface to interface for passivation layers made of either silicon carbon nitride or silicon nitride. It is believed to be advantageous for the oxygen atomic concentration at the interface between the Cu pad and the passivation layer to be below about 10%.

Passivation layers containing either silicon nitride or silicon carbon nitride both showed lower oxygen atomic concentration at the surface than bare copper without any passivation layer, so the presence of a silicon-containing passivation layer is easily seen to be advantageous. However, the lower oxygen atomic concentration at the surface of the passivation layers made of silicon carbon nitride indicates that silicon carbon nitride is superior to silicon nitride as it is expected to provide greater passivation, i.e., protection of the copper from oxidation.

It was found that passivation layers containing either silicon nitride or silicon carbon nitride and fabricated using PECVD possessed acceptable characteristics based on baking test, humidity test and initial bonding test results. However, the deposition time for silicon nitride (3 seconds) was too short because it was not adequately controllable due to the initial plasma striking step. Formation of the silicon carbon nitride passivation layer using PECVD allows a lower deposition rate with better thickness controllability. Since the passivation layer of silicon carbon nitride passed the SLAT and the baking test, excellent bond strength was expected.

As evident from Table 3, the deposition rates for silicon carbon nitride were slower than for silicon nitride.

TABLE 3

| Deposition Time (seconds) | Silicon Nitride Thickness (Angstroms) | Silicon Carbon Nitride Thickness (Angstroms) |
|---|---|---|
| 4 | 86.3 | 5.9 |
| 5 | 107.6 | 18.9 |
| 10 | | 75.9 |
| 15 | | 107.4 |

Wire bond tests were also performed using bare copper wire and palladium coated copper (PCC) wire bonded to copper pads having a silicon carbon nitride passivation layer (7 nm thick) by a ball bonding technique having the following parameters:
  Apparatus used: CABGA, 277BD, 416LD
  Die Size: 7.5×9.4 millimeters
  Die attach: Ablesstik 2300,
  Wire: 20 micrometers PCC/bare Cu
  Mold Compound: G750SE
  BGA Ball size: 0.5 millimeters Sn95.5Ag4Cu0.5

The results of this testing showed similar acceptable performance for both base copper and PCC wires on copper pads having a silicon carbon nitride passivation layer.

While at least one exemplary embodiment has been presented in the foregoing detailed description of the integrated circuits and methods for making same, it should be appreciated that a vast number of variations exist. It should also be appreciated that the exemplary embodiment or exemplary embodiments are only examples, and are not intended to limit the scope, applicability, or configuration of the integrated circuits or methods described herein in any way. Rather, the foregoing detailed description will provide those skilled in the art with a convenient road map for implementing an exemplary embodiment of the integrated circuit and methods for making same. It being understood that various changes may be made in the function and arrangement of elements described in an exemplary embodiment without departing from the scope of the integrated circuits and methods for making same, as set forth in the appended claims.

What is claimed is:

1. A integrated circuit comprising:
    a substrate;
    a copper bond pad having a contact surface, the copper bond pad overlying the substrate;
    a passivation layer comprising silicon carbon nitride disposed on the contact surface; and
    a conductive element bonded to the copper bond pad through the passivation layer with a weld.

2. The integrated circuit of claim 1, wherein the passivation layer has a thickness of from about 3 to about 15 nanometers (nm).

3. The integrated circuit of claim 2, wherein the passivation layer has a thickness of from about 5 to about 8 nm.

4. The integrated circuit of claim 1, wherein the copper bond pad comprises pure copper, doped copper, or a copper alloy.

5. The integrated circuit of claim 4, wherein the doped copper comprises at least 90 weight percent (wt %) copper based on a total weight of the bond pad.

6. The integrated circuit of claim 5, wherein the doped copper comprises aluminum, manganese, gold or a combination thereof.

7. The integrated circuit of claim 4, wherein the copper alloy comprises at least 55 wt % copper based on a total weight of the copper bond pad.

8. The integrated circuit of claim 7, wherein the copper alloy comprises aluminum, gold, or a combination thereof.

9. The integrated circuit of claim 1, wherein the conductive element is bonded to the copper bond pad through the passivation layer with a ball bond forming the weld.

10. The integrated circuit of claim 9, wherein the conductive element is a wire.

11. The integrated circuit of claim 1, wherein the passivation layer comprises stoichiometric silicon carbon nitride SiCN.

12. A method for fabricating an integrated circuit comprising the steps of:
providing a semiconductor substrate having a copper bond pad overlying a surface of the semiconductor substrate, the copper bond pad having a contact surface;
forming a passivation layer comprising silicon carbon nitride on the contact surface of the copper bond pad using a chemical vapor deposition (CVD) technique; and
bonding a conductive element to the copper bond pad through the passivation layer with a weld.

13. The method of claim 12, wherein forming the passivation layer comprises forming the passivation layer by plasma enhanced chemical vapor deposition (PECVD).

14. The method of claim 13, wherein the PECVD is performed at a temperature in a range of from about 250 to about 400° C.

15. The method of claim 13, wherein the PECVD is performed using radio frequency (RF) energy in a range of from about 180 to about 500 Watts.

16. The method of claim 13, wherein the PECVD is performed at a deposition rate of no greater than about 3 nanometers (nm) per 5 seconds (s) (0.6 nm/s).

17. The method of claim 16, wherein the PECVD is performed at a deposition rate of no greater than about 3 nm per 8 seconds (s) (3 nm/8 s).

18. The method of claim 13, wherein the PECVD is performed for a period of time required to form the passivation layer having a thickness from about 3 to about 15 nanometers (nm).

19. The method of claim 12, further comprising electrically coupling the copper bond pad to the conductive element after forming the passivation layer.

20. A method for fabricating an integrated circuit, the method comprising the steps of:
providing a semiconductor substrate having a copper bond pad overlying a surface of the semiconductor substrate, the copper bond pad having a contact surface;
depositing a passivation layer comprising silicon carbon nitride on the contact surface of the copper bond pad using plasma-enhanced chemical vapor deposition; and
electrically coupling a conductive element to the copper bond pad through the passivation layer with a weld after depositing the passivation layer.

* * * * *